(12) United States Patent
Jochman et al.

(10) Patent No.: US 12,114,454 B2
(45) Date of Patent: Oct. 8, 2024

(54) POWER SYSTEMS AND ENCLOSURES FOR POWER SYSTEMS

(71) Applicant: Illinois Tool Works Inc., Glenview, IL (US)

(72) Inventors: Nathan Joe Jochman, Neenah, WI (US); Logan Matthew VandeCorput, Freedom, WI (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 280 days.

(21) Appl. No.: 17/855,111

(22) Filed: Jun. 30, 2022

(65) Prior Publication Data
US 2024/0008206 A1 Jan. 4, 2024

(51) Int. Cl.
*H05K 5/04* (2006.01)
*B21D 5/00* (2006.01)

(52) U.S. Cl.
CPC ............... *H05K 5/04* (2013.01); *B21D 5/00* (2013.01)

(58) Field of Classification Search
None
See application file for complete search history.

*Primary Examiner* — Hao C Nguyen
*Assistant Examiner* — John B Freal
(74) *Attorney, Agent, or Firm* — McAndrews, Held & Malloy, Ltd.

(57) ABSTRACT

Disclosed power systems include an enclosure comprising a panel formed from a single sheet of metal. The panel comprises a first formed portion facing a first direction, a second formed portion facing a second direction opposite the first direction, and a center surface. The power system further includes an engine within the enclosure and a generator within the enclosure and configured to convert mechanical power from the engine to electrical power.

19 Claims, 8 Drawing Sheets

FIG. 6

POWER SYSTEMS AND ENCLOSURES FOR POWER SYSTEMS

FIELD OF THE DISCLOSURE

This disclosure is directed generally to power systems and, more particularly, to enclosures for power systems.

BACKGROUND

Conventionally, engine-driven power systems (e.g., generators/air compressors/welders) are contained within a metal enclosure that provides environmental protection for the equipment and provides a safety, sound, and aesthetic barrier for the operators. Many different types of enclosures have been used for conventional power systems. Conventional enclosures are configured with components in such a way as to house the engine and/or generator components based on their relative locations.

SUMMARY

Power systems and enclosures for power systems are disclosed, substantially as illustrated by and described in connection with at least one of the figures.

BRIEF DESCRIPTION OF THE DRAWINGS

The features of the present disclosure will best be understood from a detailed description of the invention and a preferred embodiment thereof selected for the purposes of illustration and shown in the accompanying drawings.

The figures are not necessarily to scale. Where appropriate, similar or identical reference numbers are used to refer to similar or identical components.

DETAILED DESCRIPTION

Engine-driven power systems, which generate and output one or more types of mechanical, electrical, pneumatic, hydraulic, and/or other types of power. The components of power systems are typically within an enclosure. In some conventional power systems, the enclosure may be made of sheet metal, which can be formed using a draw die process (e.g., a method of forming a flat sheet metal blank into a predetermined shape by controlling the flow of material). Conventional enclosures formed using draw die processes are difficult to form, result in deformation of features formed on the sheet metal prior to the draw die process, and/or require forming features after completion of the draw die process.

In contrast with conventional enclosures, power systems disclosed herein includes an enclosure with at least one panel formed from a single sheet of metal and including a first formed portion facing a first direction and a second formed portion facing a second direction opposite the first direction. In some examples, the first and second formed portions define an S-shaped cross-section. In examples in which a panel includes a first formed portion facing a first direction and a second formed portion facing a second direction opposite the first direction, forming the panel of the enclosure using a draw die method may be less complicated, cheaper, and faster than forming a panel of a conventional power system. For example, the first and second formed portions (e.g., the S-shaped cross-section) may provide a material holding zone during the draw die process to better restrict and/or control the flow of material. In turn, the panels including the S-shaped cross-section as disclosed herein may be stronger and result in fewer deformities to preformed features in the panel. Additionally, or alternatively, the at least one panel of the enclosure including the first and second formed portions may be more aesthetically pleasing than conventional power system enclosures.

Figure 1:
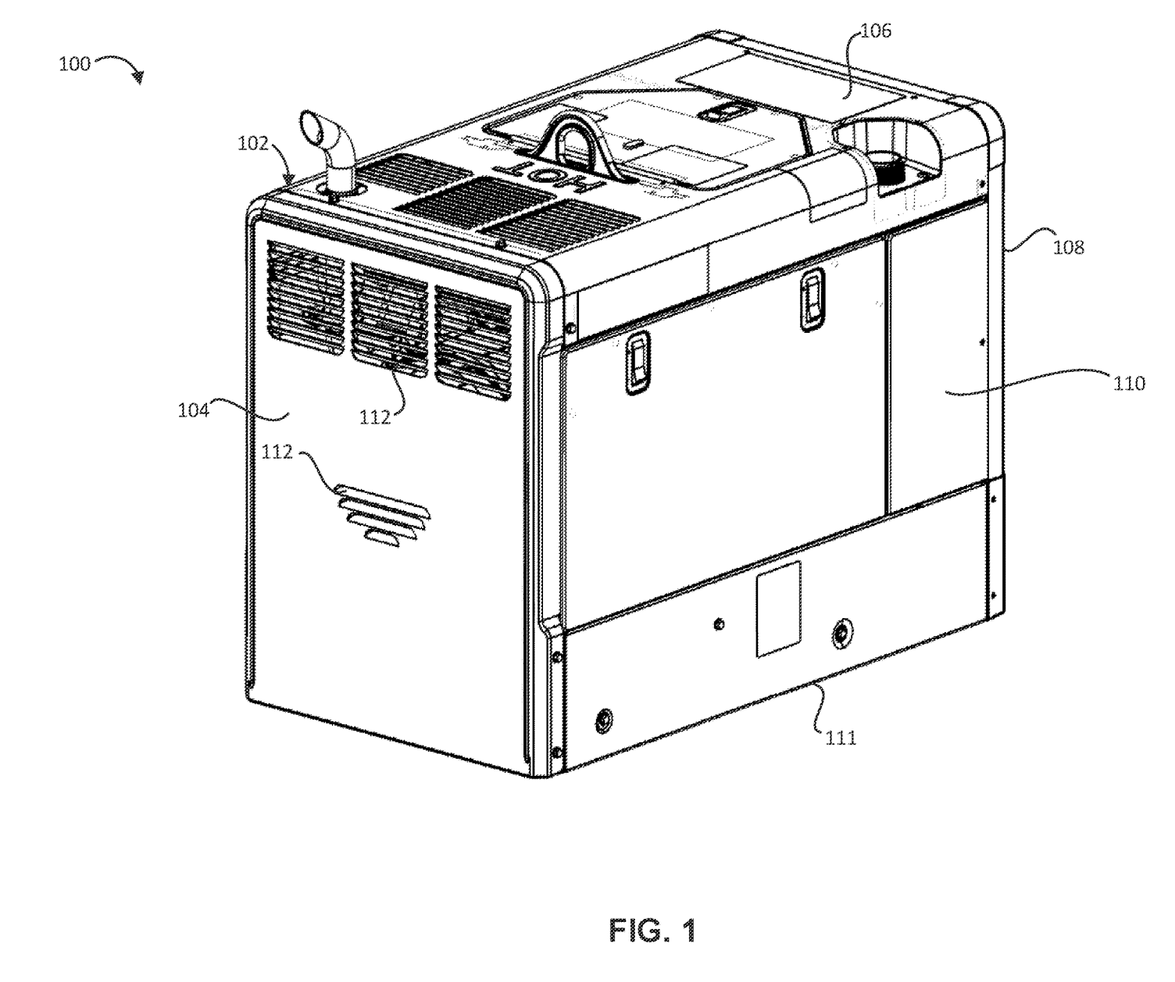
FIG. 1 is a perspective view of an example power system including an enclosure with a rear panel, in accordance with aspects of this disclosure.

FIG. 1 is a perspective view of an example power system 100 including an enclosure 102 with a rear panel 104. The power system 100 may be used for various applications, such as, for example, providing compressed air, generating power, pumping, and/or welding support. As illustrated in FIG. 1, the power system 100 includes the enclosure 102. The enclosure 102 protects internal components of the power system 100 from the environment, as well as providing a safety, sound, and aesthetic barrier for an operator using or within range of the power system 100. The enclosure 102 is primarily constructed with sheet metal, and may include multiple panels. For example, the enclosure 102 may include the rear panel 104, a top panel 106, a front panel 108, side panels 110, and a bottom panel 111 when installed in a predetermined orientation (e.g., when the power system 100 is installed in accordance with the intended use of the power system 100).

Any of the rear panel 104, the top panel 106, the front panel 108, the side panels 110, or the bottom panel 111 may include multiple panels. One or more of the panels may be removable and/or one or more of the panels may open, to permit access. In other examples, some or all of the panels (e.g., the rear panel 104) may include a single, unitary panel.

In some examples, one or more of the rear panel 104, the top panel 106, the front panel 108, the side panels 110, or the bottom panel 111 may define additional features. For example, the rear panel 104 may define louvers 112 to permit airflow into or out of the enclosure 102. Additionally, or alternatively, the rear panel 104 may include other features, such as, for example, features that extend at a non-zero angle from a center surface (discussed in more detail below) of the rear panel 104, apertures, cut-outs, or the like. Any of the rear panel 104, the top panel 106, the front panel 108, the side panels 110, or the bottom panel 111 may include additional or alternative features.

Although the disclosure is described with respect to the rear panel 104 of a power system 100, other surfaces and/or devices may benefit from the advantages of a panel including an S-shaped cross-section as described herein. Thus, the disclosure is in no way limited to rear panels of enclosures or enclosures for power systems. For example, any of the front panel 108, the top panel 106, the side panels 110, or the bottom panel 111 may include the first formed portion and second formed portion defining the S-shaped cross-section as disclosed. Additionally, or alternatively, a system or device other than a power system may include a panel including the first formed portion and second formed portion defining the S-shaped cross-section as described herein.

While the enclosure 102 is described herein as including six sides—the rear panel 104, the top panel 106, the front panel 108, two side panels 110, and the bottom panel 111, this naming convention is for ease of description only. Indeed, one or more of the rear panel 104, the top panel 106, the front panel 108, the side panels 110, or the bottom panel 111 may form a portion of another of the rear panel 104, the top panel 106, the front panel 108, the side panels 110, or the bottom panel 111. For example, as discussed in more detail below, the rear panel 104 may define a transition from a center surface of the rear panel 104 to a flange that is perpendicular to the center surface (e.g., along the top of the enclosure 102). In this way, the rear panel 104 may define a portion of the top of the enclosure 102. Thus, the rear panel 104 should be understood to include the surface of the enclosure 102 that defines the majority of a rear end of the enclosure 102; the top panel 106 should be understood to include the surface of the enclosure 102 that defines the majority of a top end of the enclosure 102; the front panel 108 should be understood to include the surface of the enclosure 102 that defines the majority of a front end of the enclosure 102; each side panel 110 should be understood to include a surface of the enclosure 102 that defines the majority of a side of the enclosure 102; and the bottom panel 111 should be understood to include the surface of the enclosure 102 that defines the majority of a bottom end of the enclosure 102. In some examples, each of the rear panel 104, the top panel 106, the front panel 108, the side panels 110, or the bottom panel 111 is an unbroken piece of material. In some such examples, the unbroken piece of material may include multiple portions defining different shapes (e.g., a flat center portion, a flange, etc.) and/or directions (e.g., front, rear, top, sides, or bottom).

Figure 2:
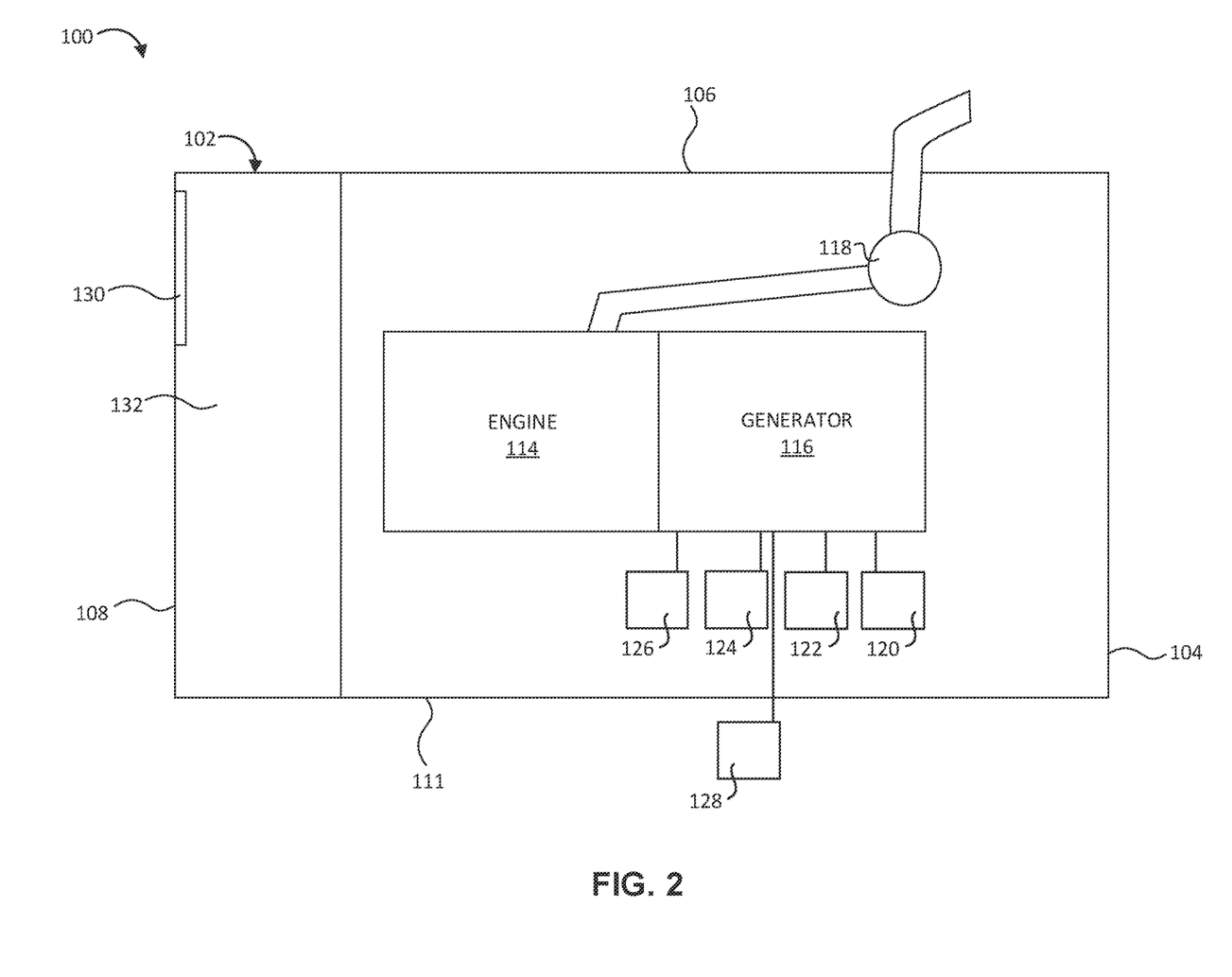
FIG. 2 is a block diagram of the example power system of FIG. 1.

FIG. 2 is a block diagram of the example power system 100 of FIG. 1. The example power system 100 may include other components not specifically discussed herein, or may omit one or more of the components discussed herein. The components of the power system 100 may be arranged within the enclosure 102 in any suitable configuration. The example power system 100 of FIG. 2 is an engine-driven power system. The system 100 includes an engine 114 that drives a generator 116 to generate electrical power. The engine 114 may be an internal combustion engine, a diesel engine, a fuel cell, etc. The engine 114 is configured to output mechanical power to drive the generator 116. The engine 114 receives fuel from a fuel tank.

In some examples, the power system 100 includes one or more power subsystems. For example, the generator 116 may provide the electrical power to welding-type conversion circuitry 120 configured to output welding-type power, an air compressor 122 configured to output pneumatic power, a hydraulic pump 124 configured to output hydraulic flow, auxiliary power conversion circuitry 126 configured to output AC power and/or DC power (e.g., DC and/or AC electrical output(s)), and/or any other load device. The example hydraulic pump 124 and the air compressor 122 may be powered by mechanical power from the engine 114 and/or by electrical power from the generator 116.

In some examples, an external power supply subsystem 128 may be coupled (e.g., plugged in, hardwired, etc.) to the power system 100 to convert at least one of the AC power or the DC power from the auxiliary power conversion circuitry 126 and/or the generator 116 to at least one of AC power or DC power, such as to power external devices that have different power requirements. The example external power supply subsystem 128 may also be communicatively coupled to control circuitry 132 of the power system 100 (e.g., wirelessly, via power line communication, via a communication cable, etc.) to enable the control circuitry 132 to control the demand and/or output of the external power supply subsystem 128.

The welding-type conversion circuitry 120 converts output power from the generator 116 (e.g., via the intermediate voltage bus) to welding-type power based on a commanded welding-type output. The welding-type conversion circuitry 120 provides current at a desired voltage to an electrode and a workpiece via output terminals to perform a welding-type operation. The welding-type conversion circuitry 120 may include, for example, a switched mode power supply or an inverter fed from an intermediate voltage bus. The welding-type conversion circuitry 120 may include a direct connection from a power circuit to the output (such as to the weld studs), and/or an indirect connection through power processing circuitry such as filters, converters, transformers, rectifiers, etc.

The auxiliary power conversion circuitry 126 converts output power from the generator 116 (e.g., via the intermediate voltage bus) to AC power (e.g., 120 VAC, 240 VAC, 50 Hz, 60 Hz, etc.) and/or DC power (e.g., 12 VDC, 24 VDC, battery charging power, etc.). The auxiliary power conversion circuitry 126 outputs one or more AC power outputs (e.g., AC outlets or receptacles) and/or one or more DC power outputs (e.g., DC outlets or receptacle). The power system 100 enables multiple ones of the power subsystems (e.g., the hydraulic pump, the air compressor 122, the welding-type conversion circuitry 120, the auxiliary power conversion circuitry 126, the external power supply subsystem 128, etc.) to be operated simultaneously.

In some examples, the power system 100 includes a user interface 130. The user interface 130 includes an input device configured to receive inputs selecting mode(s) representative of welding-type processes, mode(s) representative of one or more battery charging modes, mode(s) representative of a vehicle load, and/or other modes such as a pneumatic load and/or a hydraulic load.

The power system 100 includes an exhaust system 118. In some examples, the exhaust system 118 includes a muffler and a tail pipe. The exhaust system 118 is configured to release exhaust gases from the engine 114 external to the enclosure 102 and reduce the sound of the engine 114 during operation.

Figure 3:
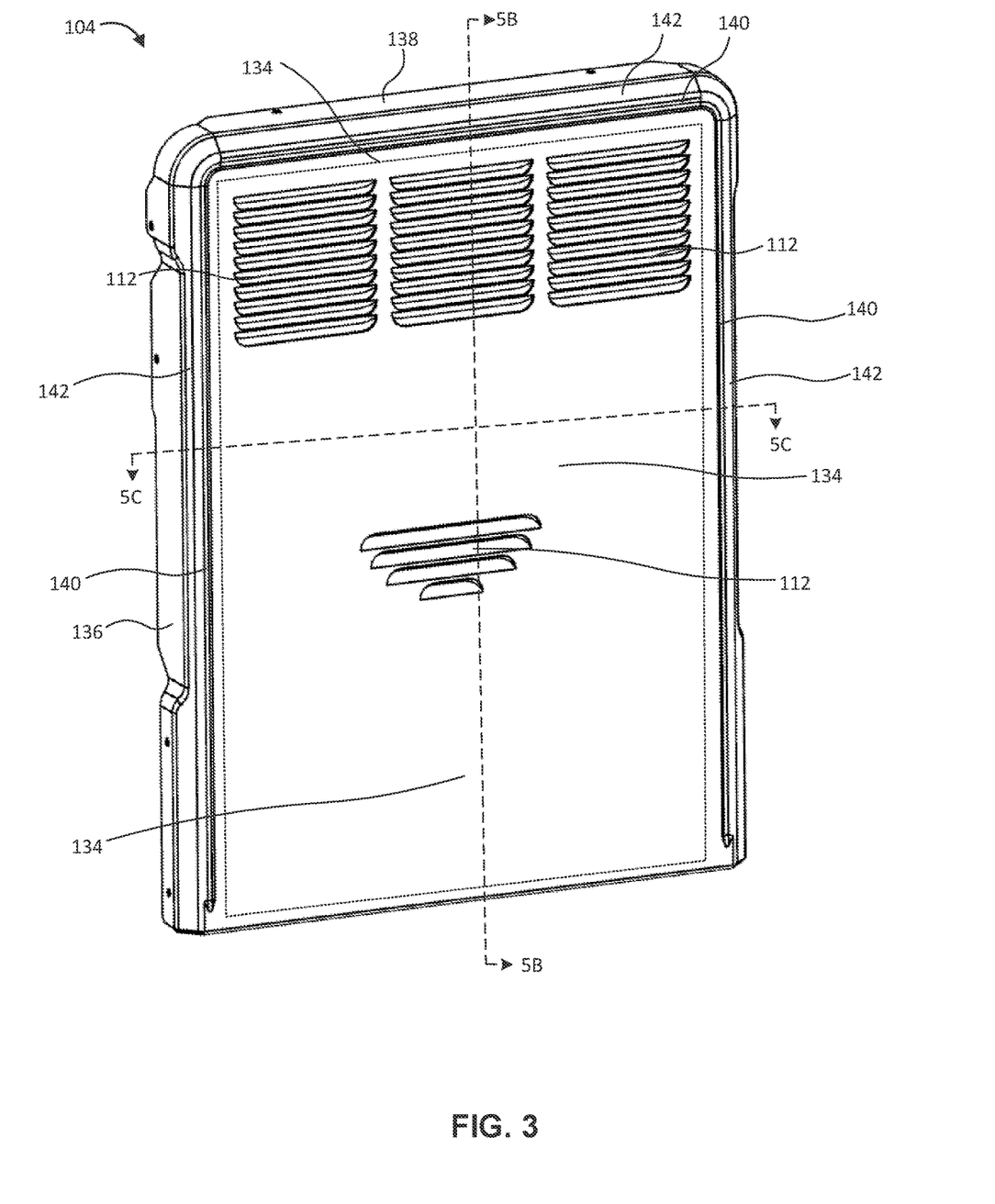
FIG. 3 is perspective view of the rear panel of the enclosure of FIG. 1.

FIG. 3 is perspective view of the rear panel 104 of the enclosure 102 of FIG. 1. The rear panel 104 includes a center surface 134. The center surface 134 may be substantially flat (e.g., defines a plane without ridges, undulations, etc.). The center surface 134 may define the majority of the rear panel 104. As discussed above, the center surface 134 defines louvers 112 to permit airflow into or out of the enclosure 102 through the rear panel 104. In some examples, the louvers 112 may extend at a non-zero angle from the center surface 134. In addition to, or as an alternative to, the louvers 112, the center surface 134 may include features such as apertures, cut outs, etc. In other examples, the center surface 134 may not include louvers 112 or any other features.

In some examples, the rear panel 104 may include one or more flanges. For example, the rear panel 104 illustrated in FIG. 3 includes side flanges 136 and a top flange 138. In some examples, the side flanges 136 and the top flange 138 may be perpendicular to the center surface 134. The side flanges 136 may be used to couple the rear panel 104 to a respective side panel 110 of the enclosure 102. Similarly, the top flange 138 may be used to couple the rear panel 104 to the top panel 106 of the enclosure 102. For example, the side flanges 136 and/or the top flange 138 may include one or more apertures configured to receive a bolt, screw, or another attachment mechanism to couple the rear panel 102 to the side panels 110 and the top panel, respectively. In other examples, the rear panel 104 may not include one or more of the side flanges 136 or the top flange 138. Additionally, or alternatively, the rear panel 104 may include a bottom flange similar to the side and top flanges 136, 138.

The rear panel 104 includes a first formed portion 140 and a second formed portion 142. In some examples, the first and second formed portions 140, 142 may be along one or more edges of the center surface 134. For example, the rear panel 104 illustrated in FIG. 3 includes the first formed portion 140 and the second formed portion 142 along two side edges and a top edge of the center surface 134. In some examples, the first and second formed portions 140, 142 may be between the flanges 136, 138 and the center surface 134, thereby defining a transition from the center surface 134 to the flanges 136, 138 (e.g., similar to a corner). In this way, the first and second formed portions 140, 142 may be between a drawn portion (e.g., flanges 136, 138 of a draw die process) and a non-drawn portion (e.g., center portion 134).

Figure 4:
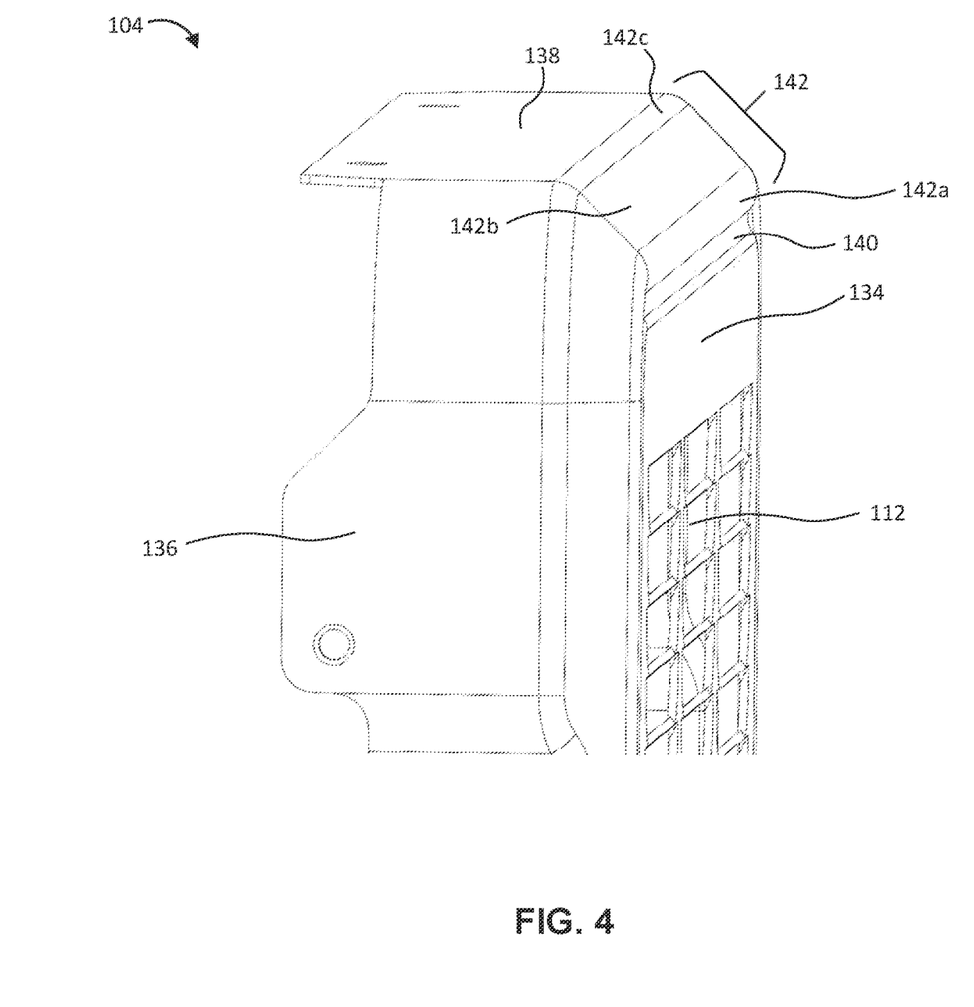
FIG. 4 is an enlarged perspective view of the rear panel of the enclosure including the first formed portion and the second formed portion of FIGS. 1 and 3.

FIG. 4 is an enlarged perspective view of the rear panel 104 of the enclosure 102 including the first formed portion 140 and the second formed portion 142 of FIGS. 1 and 3. As illustrated in FIG. 4, the first formed portion 140 is between the center surface 134 and the second formed portion 142. The second formed portion 142 is between the first formed portion 140 and the flanges 136, 138. In this way, the transition from the center surface 134 to the flanges 136, 138 perpendicular to the center surface 134 is defined by the first formed portion 140 and the second formed portion 142.

In some examples, the first formed portion 140 includes a first rounded portion and/or the second formed portion 142 includes a second rounded portion. Additionally, or alternatively, the second formed portion 142 may include a chamfered portion (e.g., a portion at a 45 degree angle to the center surface 134 and the flange 136, 138). For example, the first formed portion 140 may define the first rounded portion and the second formed portion 142 may define a second rounded portion 142a, a chamfered portion 142b, and a third rounded portion 142c. In such examples, the combination of the chamfered portion 142b with the first and second rounded portions 142a, 142c may be more visually appealing than a transition from the center surface 134 to the flange 136, 138 that is a straight chamfer (e.g., without the second and third rounded portions 142a, 142c) or that includes sharper edges than the first and second formed portions 140, 142 disclosed herein. Moreover, as discussed in more detail below, the first and second formed portions 140, 142 may provide a material holding zone (e.g., a pinch point) during a draw die process to form rear panel 104 from a sheet of metal.

Figure 5A:
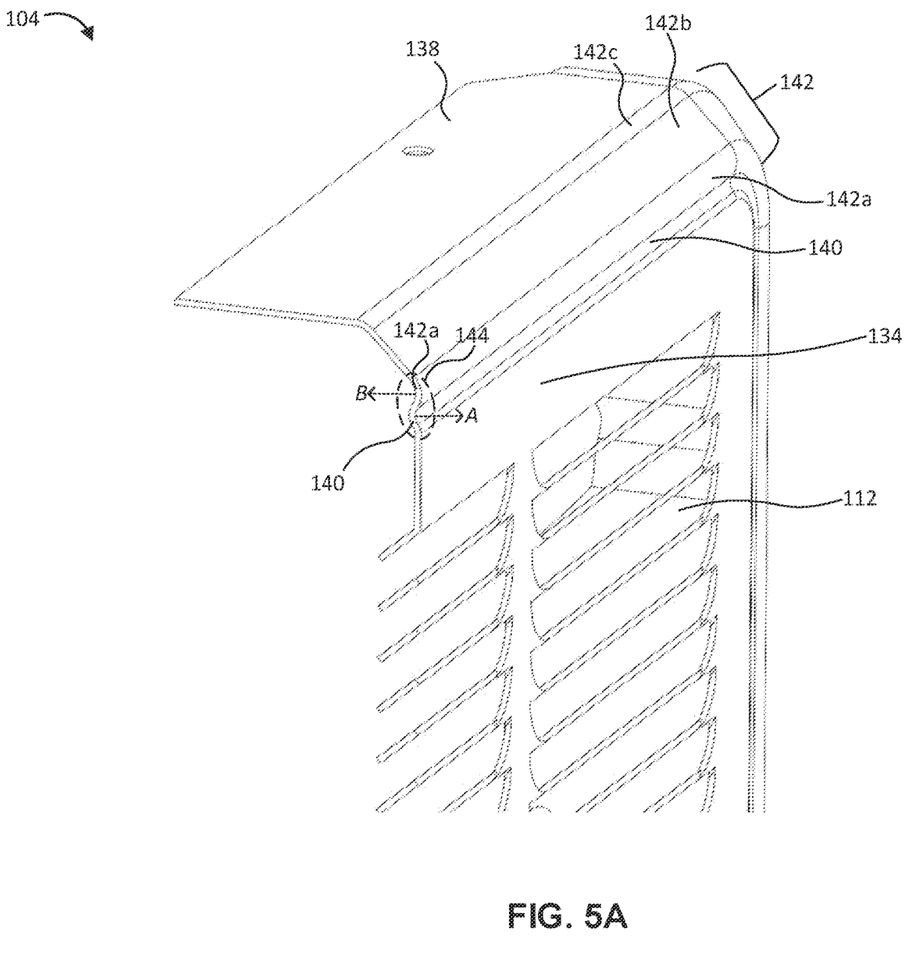
FIGS. 5A-5C are enlarged cross-sectional views of the rear panel of the enclosure including the first formed portion and the second formed portion defining an S-shape cross-section, in accordance with aspects of this disclosure.
Figure 5B:
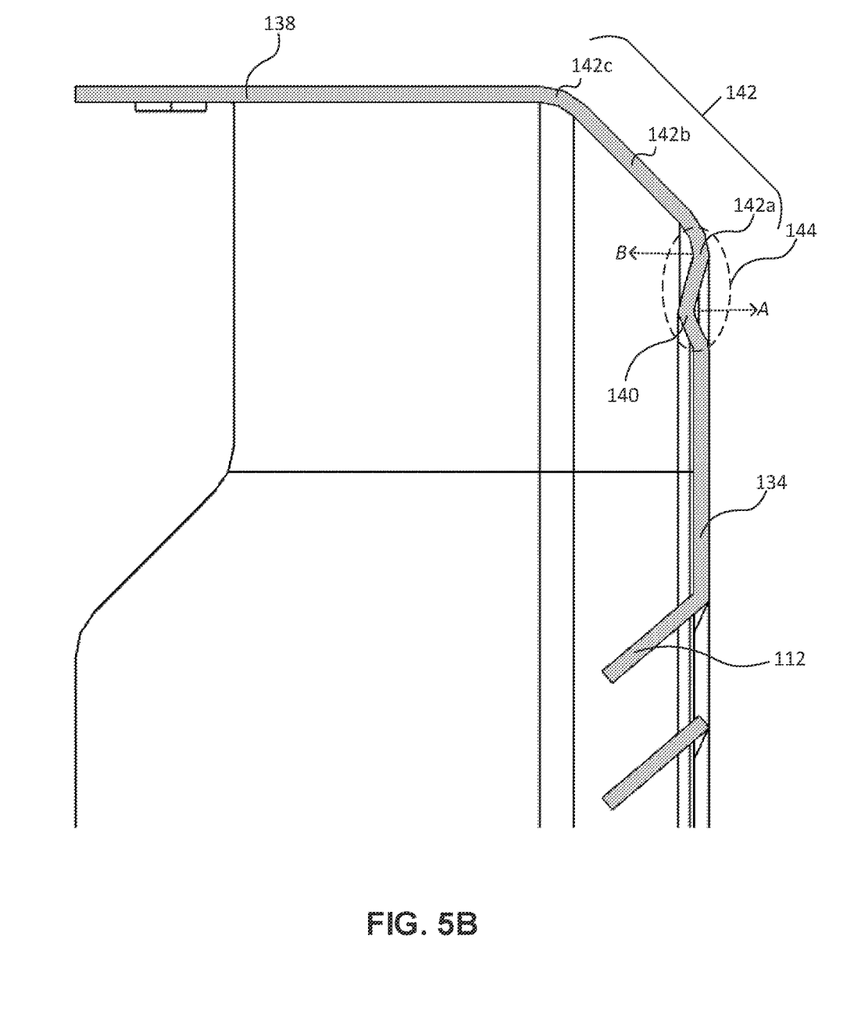
Figure 5C:
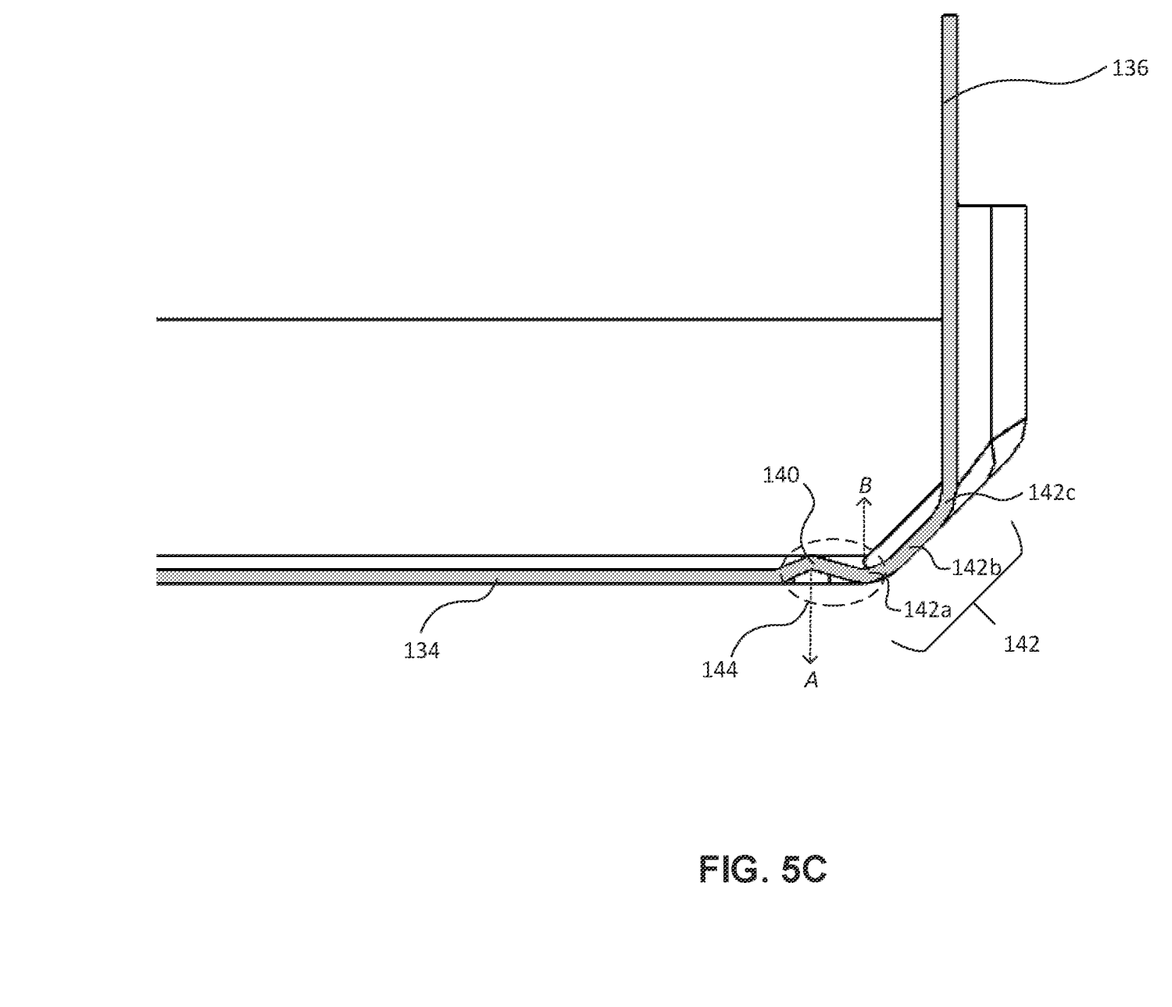

FIGS. 5A-5C are enlarged cross-sectional views of the rear panel 104 of the enclosure 102 including the first formed portion 140 and the second formed portion 142 defining an S-shape cross-section 144. FIG. 5A is an enlarged perspective cross-sectional view. FIG. 5B is an enlarged cross-sectional view taken along line 5B-5B of FIG. 3. FIG. 5C is an enlarged cross-sectional view taken along line 5C-5C of FIG. 3. As seen in FIGS. 5A-5C, at least a portion of the first formed portion 140 faces in a first direction and at least a portion of the second formed portion 142 faces in a second direction that is different than the first direction. As illustrated in FIG. 5, the first formed portion 140 faces in a first direction A (e.g., a concave surface of the first formed portion 140 faces in the first direction A) and the second rounded portion 142a of the second formed portion 142 faces in a second direction B (e.g., a concave surface of the second rounded portion 142a faces in the second direction B). In some examples, the first direction A may be the opposite direction of the second direction B. In this way, the first formed portion 140 facing the first direction A adjacent to the second formed portion 142 (e.g., the second rounded portion 142a of the second formed portion 142) facing the second direction B opposite the first direction A defines the S-shaped cross-section 144.

In some examples, the S-shaped cross-section 144 is adjacent to the center surface 134. Such a configuration may improve forming of the rear panel 104 from a single sheet of metal (as discussed in more detail below). In turn, the rear panel 104 may have improved strength properties, be capable of withstanding relatively high operating temperatures, and have less distortion of features, such as louvers 112, on the center surface 134, without the power system 100 requiring additional parts, increasing costs, or increasing the size (e.g., a length) of the power system 100 as compared to conventional power systems that do not include the disclosed S-shaped cross-section 144 or power systems that have a rear panel including plastic or multiple panels (e.g., as compared to the rear panel 104 made of a single piece of sheet metal).

Figure 6:
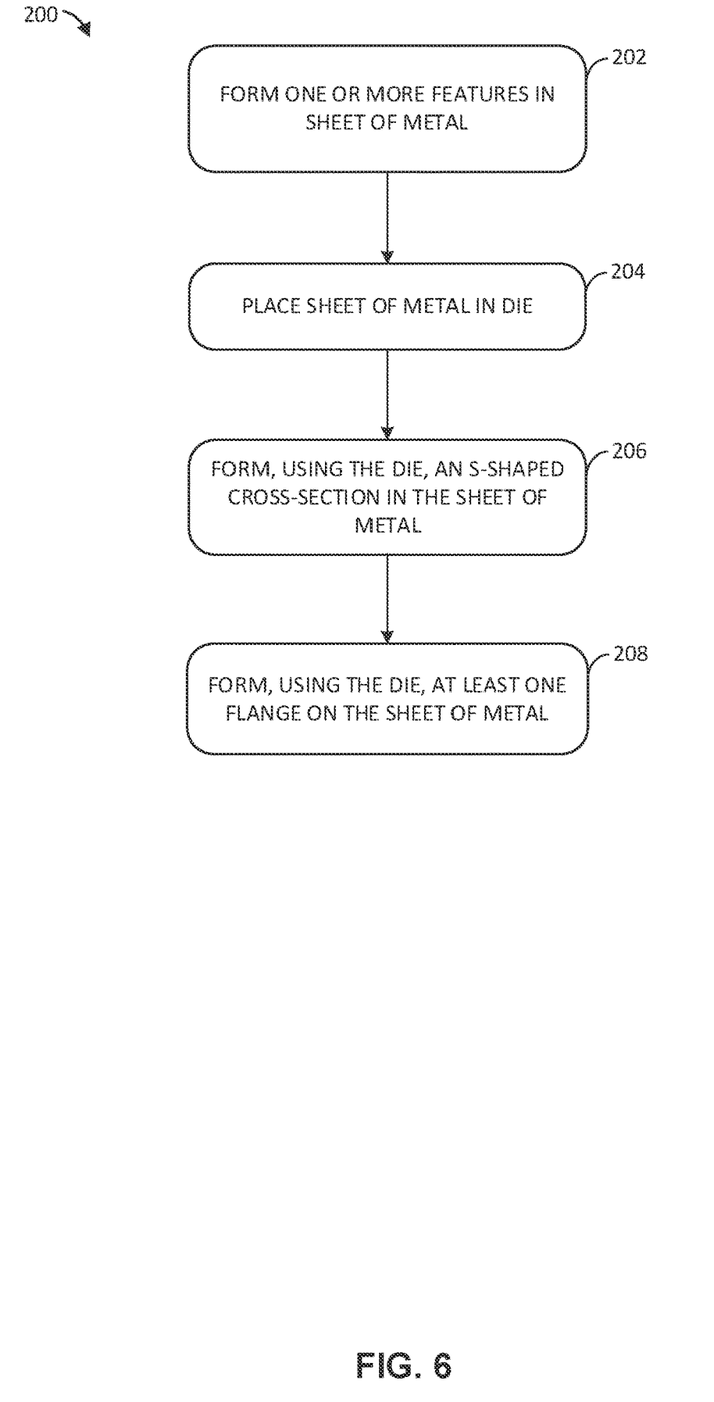
FIG. 6 is a flow chart of a method of forming the rear panel of the enclosure including the first formed portion and the second formed portion defining an S-shape cross-section, in accordance with aspects of this disclosure.

FIG. 6 is a flow chart of a method 200 of forming the rear panel 104 of the enclosure 102 including the first formed portion 140 and the second formed portion 142 defining an S-shape cross-section 144. The method 200 may optionally include forming one or more features in a sheet of metal (block 202). As discussed above, the sheet of metal may be a single sheet of metal. The features may be any suitable features. In some examples, the features may be a feature extending at a non-zero angle from the center surface 134. As one such example, the features may be louvers 112. In other examples, the one or more features may be an aperture, a cut-out, or any other feature.

The method 200 includes placing the sheet of metal in a die (block 204). In some examples, the die may be a die for use in a draw die method (e.g., a method of forming a flat blank into a predetermined shape by controlling the flow of material). The die is configured to form the sheet of metal into a predetermined shape. For example, the die may be configured to form the sheet of metal into the rear panel 104 including the center surface 134, the first formed portion 140, the second formed portion 142, and one or more flanges 136, 138.

The method 200 further includes forming, using the die, the S-shaped cross section 144 in the sheet of metal (block 206). In some examples, a draw die process is used to flow the metal of the sheet of metal into a cavity. In such examples, the cavity may define the first and second formed portions 140, 142, thereby defining the S-shaped cross-section 144. The method 200 may further include forming at least one flange 136, 138 on the sheet of metal (block 208). In some examples, the draw die process may include flowing the metal of the sheet of metal into a cavity to form the at least one flange 136, 138.

In examples in which the S-shaped cross-section 144 is formed in the sheet of metal, the forming process disclosed herein may result in a rear panel 104 with increased strength and reduced warpage or distortion of the features in the center surface 134. For example, the S-shaped cross-section 144 may provide a material holding zone (e.g., preventing material of the center surface 134 from flowing) in the sheet of metal during formation of the at least one flange 136, 138. In other words, the S-shaped cross-section 144 may prevent flow of material from the center surface 134 while still allowing flow of material to form the at least one flange 136, 138. In this way, the features formed in the center surface 134 (e.g., louvers 112) do not get distorted, the center surface 134 does not get stretched, etc. In addition, a single die may be able to be used to form any panel including the S-shaped cross-section 144, despite any potential differences in features (or a lack of features) in the center surface 134. Moreover, the features are able to be formed in the center surface 134 prior to forming the final rear panel 104. This is advantageous because forming features in the center surface 134 after the draw die process may be more difficult, time-consuming, and/or expensive as compared to forming the features prior to using the draw die process to create the first formed portion 140, the second formed portion 142, and the flanges 136, 138.

In other examples, other processes (e.g., other than a draw die process) may be used to form rear panel 104 into a predetermined shape. For example, the sheet of metal may be bent to form the first formed portion 140, second formed portion 142, and/or flanges 136, 138. In yet other examples, a combination of forming processes may be used to form rear panel 104 into the predetermined shape.

As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. For example, systems, blocks, and/or other components of disclosed examples may be combined, divided, re-arranged, and/or otherwise modified. Therefore, the present method and/or system are not limited to the particular implementations disclosed. Instead, the present method and/or system will include all implementations falling within the scope of the appended claims, both literally and under the doctrine of equivalents.

What is claimed is:

1. A power system comprising:
   an enclosure comprising a panel, wherein the panel is formed from a single sheet of metal and comprises:
      a first formed portion facing a first direction,
      a second formed portion facing a second direction opposite the first direction, and
      a center surface, an engine within the enclosure; and
   a generator within the enclosure and configured to convert mechanical power from the engine to electrical power, wherein the first formed portion and the second formed portion define an S-shaped cross-section.

2. The power system of claim 1, wherein the first formed portion comprises a first rounded portion and the second formed portion comprises a second rounded portion.

3. The power system of claim 1, wherein the second formed portion comprises a chamfered portion.

4. The power system of claim 1, wherein the first formed portion and the second formed portion are along at least an edge of the panel.

5. The power system of claim 1, wherein the first formed portion is between the second formed portion and the center surface.

6. The power system of claim 1, wherein the panel further comprises one or more flanges.

7. The power system of claim 6, wherein the one or more flanges are perpendicular to the center surface.

8. The power system of claim 6, wherein the first formed portion and the second formed portion define a transition from the center surface to the one or more flanges.

9. The power system of claim 1, wherein the center surface comprises one or more features extending at a non-zero angle from the center surface, one or more apertures, or both.

10. The power system of claim 1, wherein the panel is formed using a draw die process, and wherein the S-shaped cross-section provides a material holding zone during the draw die process.

11. The power system of claim 1, further comprising one or more of:
    welding-type conversion circuitry configured to convert electrical power from the generator to welding-type power;
    an air compressor coupled to at least one of the electrical power from the generator or the mechanical power from the engine and configured to output compressed air;
    a hydraulic pump configured to generate flow from at least one of the electrical power from the generator or the mechanical power from the engine; or
    auxiliary power conversion circuitry configured to convert the electrical power from the generator to at least one of AC output power or DC output power.

12. A metal enclosure comprising:
    a plurality of panels, wherein a least one panel of the plurality of panels is formed from a single sheet of metal and comprises:
       a first formed portion facing a first direction,
       a second formed portion facing a second direction opposite the first direction, wherein the first formed portion and the second formed portion define an S-shaped cross-section, and
       a center surface.

13. The metal enclosure of claim 12, wherein the first formed portion comprises a first rounded portion and the second formed portion comprises a second rounded portion.

14. The enclosure of claim 12, wherein the second formed portion comprises a chamfered portion.

15. The enclosure of claim 12, wherein the first formed portion is between the second formed portion and the center surface.

16. The enclosure of claim 12, wherein the at least one panel further comprises one or more flanges.

17. The enclosure of claim 16, wherein the one or more flanges are perpendicular to the center surface.

18. The enclosure of claim 16, wherein the first formed portion and the second formed portion define a transition from the center surface to the one or more flanges.

19. A method comprising:
   placing a sheet of metal in a die;
   forming, using the die, an S-shaped cross-section in the sheet of metal; and
   forming, using the die, at least one flange on the sheet of metal to define a panel comprising:
      a first formed portion facing a first direction,
      a second formed portion facing a second direction opposite the first direction, wherein the first formed portion and the second formed portion define the S-shaped cross-section, and
      a center surface.

\* \* \* \* \*